(12) United States Patent
Kuenemund et al.

(10) Patent No.: US 10,199,334 B2
(45) Date of Patent: Feb. 5, 2019

(54) DIGITAL CIRCUIT AND METHOD FOR MANUFACTURING A DIGITAL CIRCUIT

(71) Applicant: Infineon Technologies AG, Neubiberg (DE)

(72) Inventors: Thomas Kuenemund, Munich (DE); Berndt Gammel, Markt Schwaben (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/887,367

(22) Filed: Oct. 20, 2015

(65) Prior Publication Data

US 2017/0110418 A1   Apr. 20, 2017

(51) Int. Cl.
*H03K 19/003* (2006.01)
*H01L 23/00* (2006.01)
*H01L 27/118* (2006.01)
*H03K 3/3562* (2006.01)

(52) U.S. Cl.
CPC ...... *H01L 23/576* (2013.01); *H01L 27/11807* (2013.01); *H03K 3/35625* (2013.01)

(58) Field of Classification Search
CPC .... H03K 3/037; H03K 3/0375; H03K 17/693; H03K 3/35625; H01L 23/576; H01L 27/11807
USPC ...................................................... 326/8, 12
See application file for complete search history.

(56) References Cited

U.S. PATENT DOCUMENTS

| 4,506,165 A * | 3/1985 | Gulati | H03K 3/3562 326/95 |
| 5,982,211 A * | 11/1999 | Ko | H03K 17/693 327/202 |
| 6,621,318 B1 * | 9/2003 | Burr | H03K 3/012 327/208 |
| 8,362,807 B2 * | 1/2013 | Upputuri | G11C 7/065 327/51 |
| 8,710,889 B1 * | 4/2014 | Chromczak | H03H 11/265 327/261 |
| 2004/0196082 A1 * | 10/2004 | Pacha | H03K 3/012 327/215 |

(Continued)

OTHER PUBLICATIONS

J. Rajandran et al., "Security Analysis of Integrated Circuit Camouflaging", CCS'13, Nov. 4-8, 2013, Berlin, Germany.

*Primary Examiner* — Don Le
(74) *Attorney, Agent, or Firm* — Viering, Jentschura & Partner MBB

(57) ABSTRACT

According to one embodiment, a method for manufacturing a digital circuit is described comprising forming a modified RS master latch with an output for outputting an output signal comprising forming two field effect transistors which are virtually identical wherein the two formed field effect transistors are connected to each other in an RS latch type configuration and the respective threshold voltages of the two field effect transistors are set to be different from each other so that the output signal of the modified RS master latch in response to an RS latch forbidden input transition has a predetermined defined logic state, forming an RS slave latch having a set input and a reset input and connecting the set input or the reset input of the RS-slave latch to the output of the modified RS master latch.

20 Claims, 10 Drawing Sheets

(56) References Cited

U.S. PATENT DOCUMENTS

| | | | |
|---|---|---|---|
| 2006/0038582 A1* | 2/2006 | Peeters | G01R 31/31701 |
| | | | 326/16 |
| 2006/0208772 A1* | 9/2006 | Nakano | H03K 5/08 |
| | | | 327/108 |
| 2010/0085081 A1* | 4/2010 | Ofuji | H01L 27/1233 |
| | | | 326/102 |
| 2011/0025393 A1* | 2/2011 | Sommer | H03K 3/012 |
| | | | 327/202 |
| 2014/0139262 A1* | 5/2014 | Penzes | G06F 17/5045 |
| | | | 326/33 |
| 2015/0294843 A1* | 10/2015 | Chen | H01J 37/32853 |
| | | | 438/710 |

* cited by examiner

DIGITAL CIRCUIT AND METHOD FOR MANUFACTURING A DIGITAL CIRCUIT

TECHNICAL FIELD

The present disclosure relates to digital circuits and methods for manufacturing a digital circuit.

BACKGROUND

Reverse engineering (RE) of integrated circuits (ICs) can be considered as one of the most serious threats to semiconductor industry, since it may be misused by an attacker to steal and/or pirate a circuit design. An attacker who successfully reverse engineers an integrated circuit can fabricate and sell a similar, i.e. cloned circuit, and illegally sell and reveal the design.

Therefore concepts and techniques that thwart reverse engineering of integrated circuits are desirable.

SUMMARY

According to an embodiment, a method for manufacturing a digital circuit is provided comprising forming a modified RS master latch with an output for outputting an output signal comprising forming two field effect transistors which are virtually identical, each field effect transistor having a respective threshold voltage, wherein the two formed field effect transistors are connected to each other in an RS latch type configuration, wherein forming the two field effect transistors comprises setting the respective threshold voltages of the two field effect transistors to be different from each other so that the output signal of the modified RS master latch in response to an RS latch forbidden input transition has a predetermined defined logic state, forming an RS slave latch having a set input and a reset input and connecting the set input or the reset input of the RS-slave latch to the output of the modified RS master latch.

According to a further embodiment, a digital circuit is provided comprising a modified RS master latch comprising an output for outputting an output signal and two field effect transistors which are virtually identical, each field effect transistor having a respective threshold voltage, wherein the two formed field effect transistors are connected to each other in an RS latch type configuration and an RS slave latch having a set input and a reset input wherein the set input or the reset input of the RS-slave latch is connected to the output of the modified RS master latch and wherein the threshold voltages of the two field effect transistors differ by at least 10 mV such that the output signal of the modified RS master latch in response to an RS latch forbidden input transition has a predetermined defined logic state.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects are described with reference to the following drawings, in which.

DESCRIPTION

Figure 1:
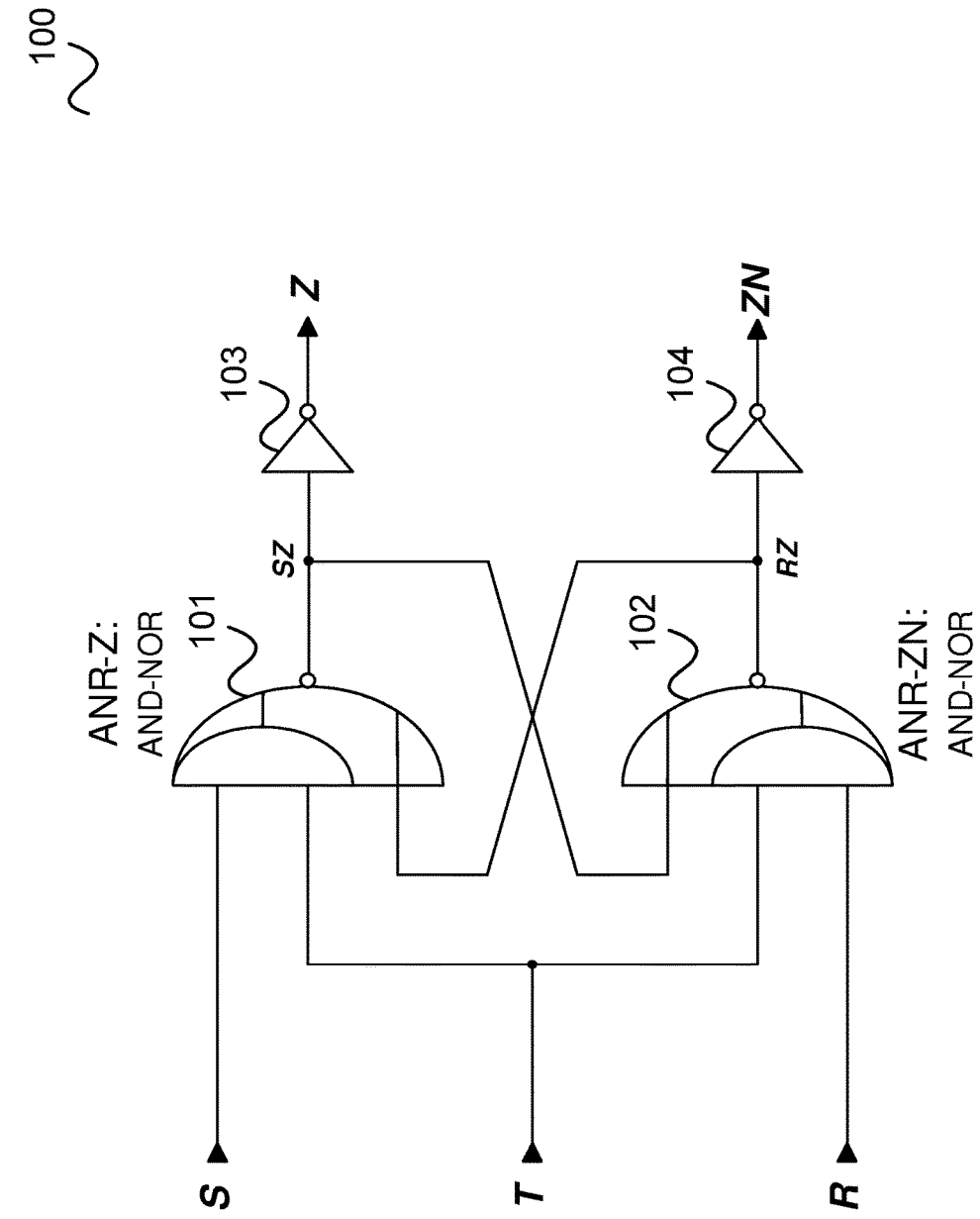
FIG. 1 shows an example of a realization of an RSX latch.

The following detailed description refers to the accompanying drawings that show, by way of illustration, specific details and aspects of this disclosure in which the invention may be practiced. Other aspects may be utilized and structural, logical, and electrical changes may be made without departing from the scope of the invention. The various aspects of this disclosure are not necessarily mutually exclusive, as some aspects of this disclosure can be combined with one or more other aspects of this disclosure to form new aspects.

Reverse engineering (RE) can be hindered by deploying camouflage circuits. However, these typically require process technology extensions like doping profile modifications, faked contacts or vias and/or entail significantly increased area and energy consumption. Thus, these measures are often too expensive for mass products.

Indistinguishable yet Complementary Bit Cells, ICBC-X (existing in two flavors or types, namely ICBC-1 and ICBC-0) representing gates that respond to an appropriate challenge by outputting a robust logical ONE or a robust logical ZERO, respectively, cannot be easily distinguished by means of Reverse Engineering (RE) and other analysis methods, i.e. attacks to Chip Card Controllers and Security ICs.

The ICBC-X's physical design is (sufficiently) symmetric in terms of its layout, i.e. its active regions, poly-silicon gates, contacts, metal connectivity etc. However, the ICBC-X's nMOS and pMOS components (i.e. nMOS and pMOS field effect transistors) feature appropriately different threshold voltages (Vth) resulting in the robust transfer characteristics of the ICBC-X when challenged with an input pattern that would otherwise cause the circuit to enter a metastable state.

Since process options "regular Vth" and "high Vth" can be used to realize an ICBC-X, no process change is required, provided a mixed-Vth scenario for the Security IC under consideration can be assumed. Further, ICBC-1 and ICBC-0 are static CMOS gates that can be implemented as elements of Standard Cell Libraries.

Application examples include "dynamical" TIE-1 and TIE-0 cells, i.e. TIE cells that can be switched between logically valid and invalid states, representing e.g. bits of a secret key or other pieces of confidential information.

Moreover, ICBC-X instances can be combined with standard logic gates to achieve RE-resistant data paths and ICBC-Xs can be concatenated to realize dynamical TIE tree structures. Session key generation as well as address-dependent memory encryption configuration are also possible.

In addition to that, after roll-out, i.e. after the ICBC-X's initial (e.g. random) configuration, the selected configuration can then be stored in a NVM (non-volatile memory), e.g. of a chip (e.g. a chip card module) including the ICBC-X, for subsequent use in the field. This may even allow for robust and RE-resistant chip-individual pieces of information.

Since a multitude of ICBC-X instances can be distributed irregularly across an IC's entire Semi-Custom portion and because these instances can be accessed in irregular, even random, temporal order, the ICBC-X concept tremendously increases the difficulty, risk and effort for all relevant Security IC attack scenarios like Reverse Engineering, Photon Emission, Laser Voltage Probing, etc.

The basic ICBC-X concept can be seen to rest upon resolving conventionally metastable states or metastable state transitions of (bistable) feedback circuitry by deploying (MOS) transistors (in general switches) with different threshold voltages (in general state transition characteristics) in order to achieve robust ICBC-X state transitions, whereupon the nature of any given ICBC-X instance (X=1 or 0?) remains concealed for an attacker employing relevant Security IC attack scenarios like Reverse Engineering, Photon Emission, Laser Voltage Probing, etc.

ICBC-X may for example include so-called RSX latches, i.e. RSX latches (i.e. Reset-Set-latches composed of cross-coupled NAND or NOR gates) whose components (the NAND or NOR gates) are structurally identically implemented but whose transfer characteristics are again asymmetric due to appropriate use of field effect transistors (e.g. MOS devices) with different threshold voltages resulting in a robust ONE or ZERO at the outputs when challenged with an input pattern that would otherwise cause the circuitry to enter a metastable state.

FIG. 1 shows an example of a realization of an RSX latch 100.

The RSX latch 100 receives three inputs S, T and R and has two (complementary) outputs Z and ZN. It is AND-NOR based and comprises a first AND-NOR 101 which receives the input signals S and T at its AND inputs and a second AND-NOR 102 which receives the input signals R and T at its AND inputs. The output of the first AND-NOR 101 is denoted by SZ and is fed to the NOR input of the second AND-NOR 102. The output of the second AND-NOR 102 is denoted by RZ and is fed to the NOR input of the first AND-NOR 101. SZ is fed to a first inverter 103 which outputs the output signal Z and RZ is fed to a second inverter 104 which outputs the output signal ZN.

The RSX latch 100 has a Set-Reset function as an RS latch:
The RSX latch 100 is set by (T, S, R)=(1, 1, 0) and the subsequent transition to (0, 1, 0) of the control signals T, S, and R, resulting in the output state (Z, Y)=(1,0);
The RSX latch 100 is reset by (T, S, R)=(1, 0, 1) and the subsequent transition to (0, 0, 1) of the control signals T, S, and R, resulting in the output state (Z, Y)=(0,1).

In addition to that, the RSX latch 100 also allows for the transition
(T, S, R)=(1, 1, 1)→(0, 1, 1), resulting in the RSX state (Z, Y)=(X, $\overline{X}$), wherein X is 0 or 1.

For a conventional RS latch this is a forbidden transition of the control signals T, S, and R, since for a conventional RS latch it would cause a metastable state (and is therefore also referred to as RS latch forbidden input transition). For the RSX latch 100, however, the two relevant (e.g. pMOS) pull-up paths within the two AND-NOR gates ANR-Z and ANR-Y that are switched on with the transition T=1→0, feature different threshold voltages according to the "Magic Hood" principle, so that metastability is avoided.

Thus, the RSX latch 100 has an additional camouflage property since it can be seen to be disguised as RS latch, deceiving and leading astray reverse engineering.

Figure 2:
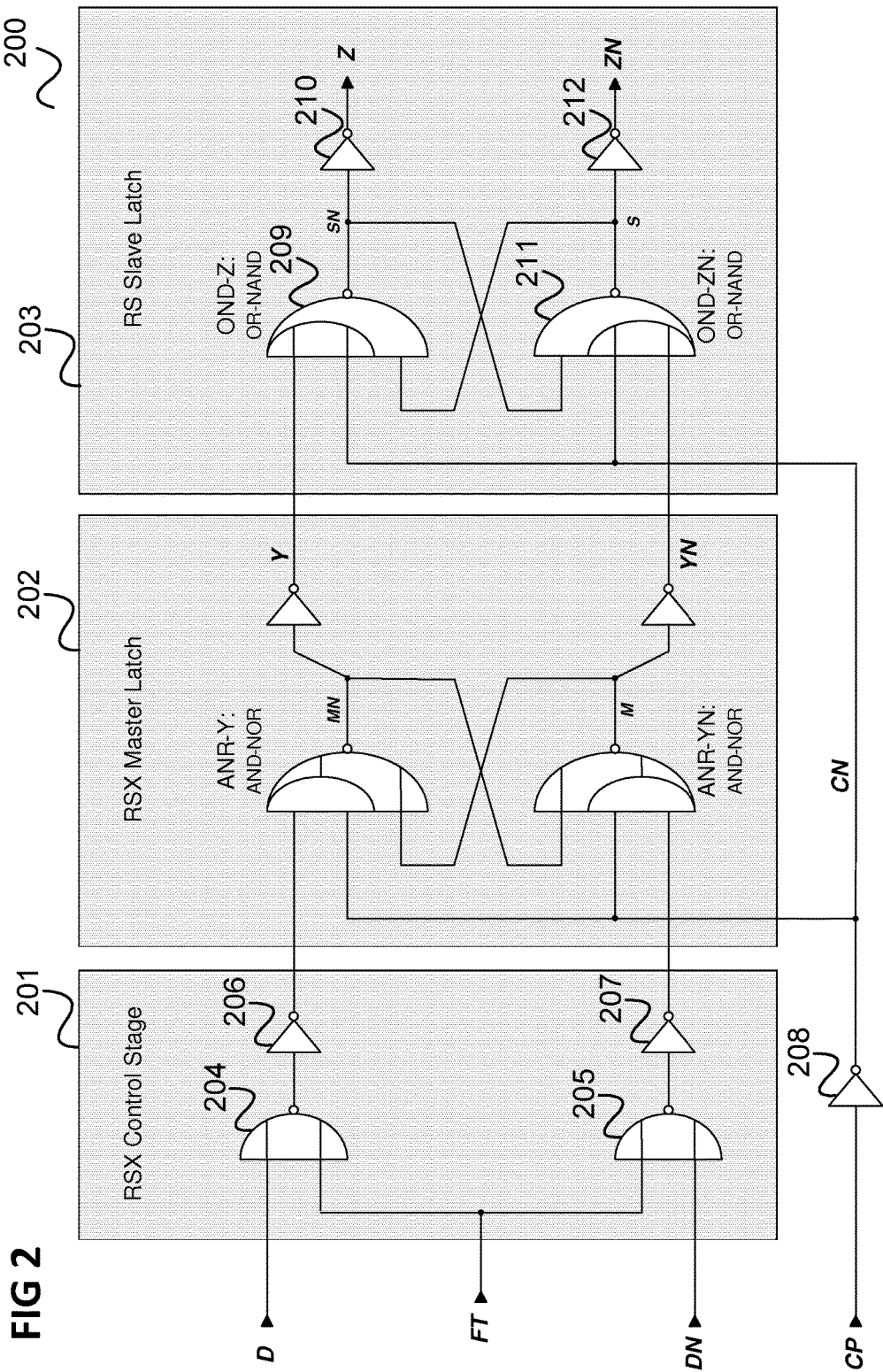
FIG. 2 shows an RSX-based master slave register.

FIG. 2 shows an RSX-based master slave register 200 (as gate schematic).

The RSX-based master slave register 200 comprises an RSX control stage 201, an RSX master latch 202 and an RS slave latch 203.

The master latch 202 is an RSX latch as described with reference to FIG. 1, wherein the outputs are denoted by Y and YN to distinguish from the outputs of the RSX-based master slave register 200 which are denoted by Z and ZN.

The RSX control stage 201 ensures the proper forbidden transition (or RS latch forbidden input transition). Specifically, the RSX control stage 201 receives input signals D, DN and FT, wherein D and FT are supplied to a first NOR 204 and DN and FT are supplied to a second NOR 205. The output of the first NOR 204 is fed to a first inverter 206 whose output is used as input signal S for the master latch 202 as described with reference to FIG. 1. The output of the second NOR 205 is fed to a second inverter 207 whose output is used as input signal R for the master latch 202 as described with reference to FIG. 1.

The register 200 further comprises a third inverter 208 which receives an input signal CP and supplies its output CN as input signal T to the master latch 202 as described with reference to FIG. 1.

The slave latch 203 may be a conventional (in other words normal) RS latch. In this example, it comprises a first OR-NAND 209 which receives CN and Y at its OR inputs. Its output signal is referred to as SN which is inverted by a fourth inverter 210 which outputs the register's output signal Z. The slave latch 203 further comprises a second OR-NAND 211 which receives CN and YN at its OR inputs. Its output signal is referred to as S which is inverted by a fifth inverter 212 which outputs the register's output signal ZN. The signal SN is supplied to the NAND input of the second OR-NAND 211 and the signal S is supplied to the NAND input of the first OR-NAND 209.

Figure 3:
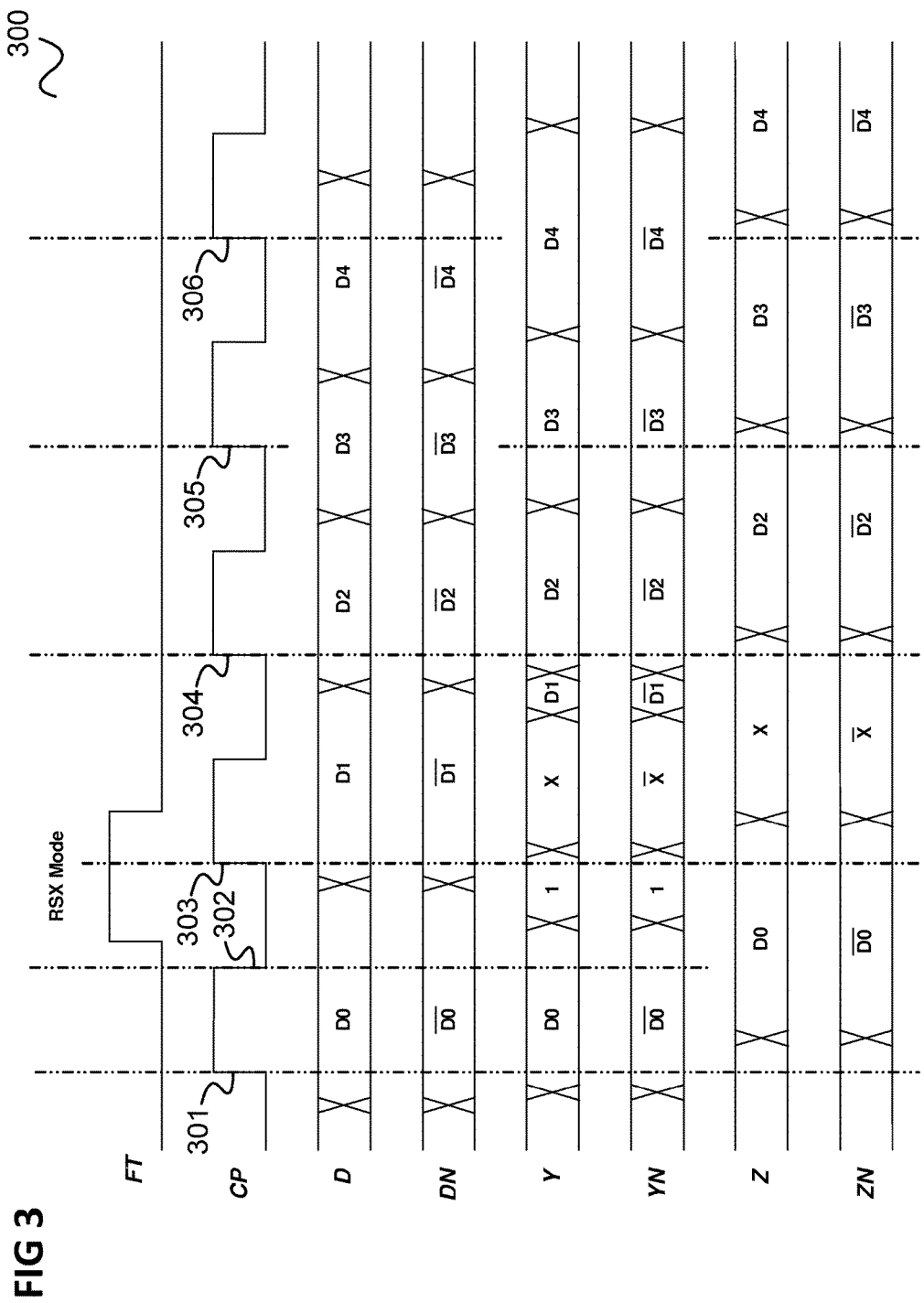
FIG. 3 shows a timing diagram for the RSX-based master slave register of FIG. 2.

FIG. 3 shows a timing diagram 300 for the RSX-based master slave register 200. It shows the states of the signals FT, CP, D, DN, Y, YN, Z and ZN over time, wherein time flows from left to right in FIG. 3.

Before the first rising edge 301 of the clock CP the (complementary) data inputs (D, DN) change to (D0,$\overline{D0}$) so that (because of FT=0 and CN=1) the master latch 202 captures this value, i.e. also (Y, YN) is set to (D0,$\overline{D0}$), and this value is also transferred to the register's output (Z, ZN) with the first rising edge 301 of CP.

Then, the signal FT is set to 1 after the falling edge 302 of the clock CP, "overwriting" (D0,$\overline{D0}$) (as well as a subsequent input pair (D1,$\overline{D1}$)) at the master latch's inputs so that (Y, YN) are set to (1, 1) after the falling edge 302 of CP.

Then, with the following rising edge 303 of CP, the forbidden RSX transition happens since the signal FT is kept at 1 until after the second rising edge 303 of CP. Thus, (Y, YN) are set to (X,$\overline{X}$) and this value is also transferred to the slave RS latch's output (Z, ZN) with the second rising edge 303 of CP. It should be noted that in this RSX mode the data (D1,$\overline{D1}$) are not transferred to the slave RS latch's output (Z, ZN), since the master RSX latch already has captured the subsequent values (D2,$\overline{D2}$) from the register's inputs (D, DN) before the relevant rising edge 304 of CP, so that the outputs (Z, ZN) change from (X,$\overline{X}$) to (D2,$\overline{D2}$) with the third rising edge 304 of CP.

For the following clock cycles FT is kept at 0, so that a regular operation mode of a master slave (clock edge sensitive) register follows: the data input sequence (D, DN)=(D2,$\overline{D2}$)→(D3,$\overline{D3}$)→(D4,$\overline{D4}$) is captured with the respective next rising edges 304, 305, 306 of CP and appears at the register's outputs.

It should be noted that the register's outputs (Z, ZN) are always complementary, i.e. it always holds that ZN=NOT (Z).

As a first possible application for the RSX based register 200 it is assumed that the inputs (D, DN) are always complementary, i.e. it is assumed that it always holds that DN=NOT(D).

This assumption can always be ensured by providing an extra inverter inverting D and using this inverter's output as DN. The additional inverter can be avoided by deploying a modified RSX control stage as illustrated in FIG. 4.

Figure 4:
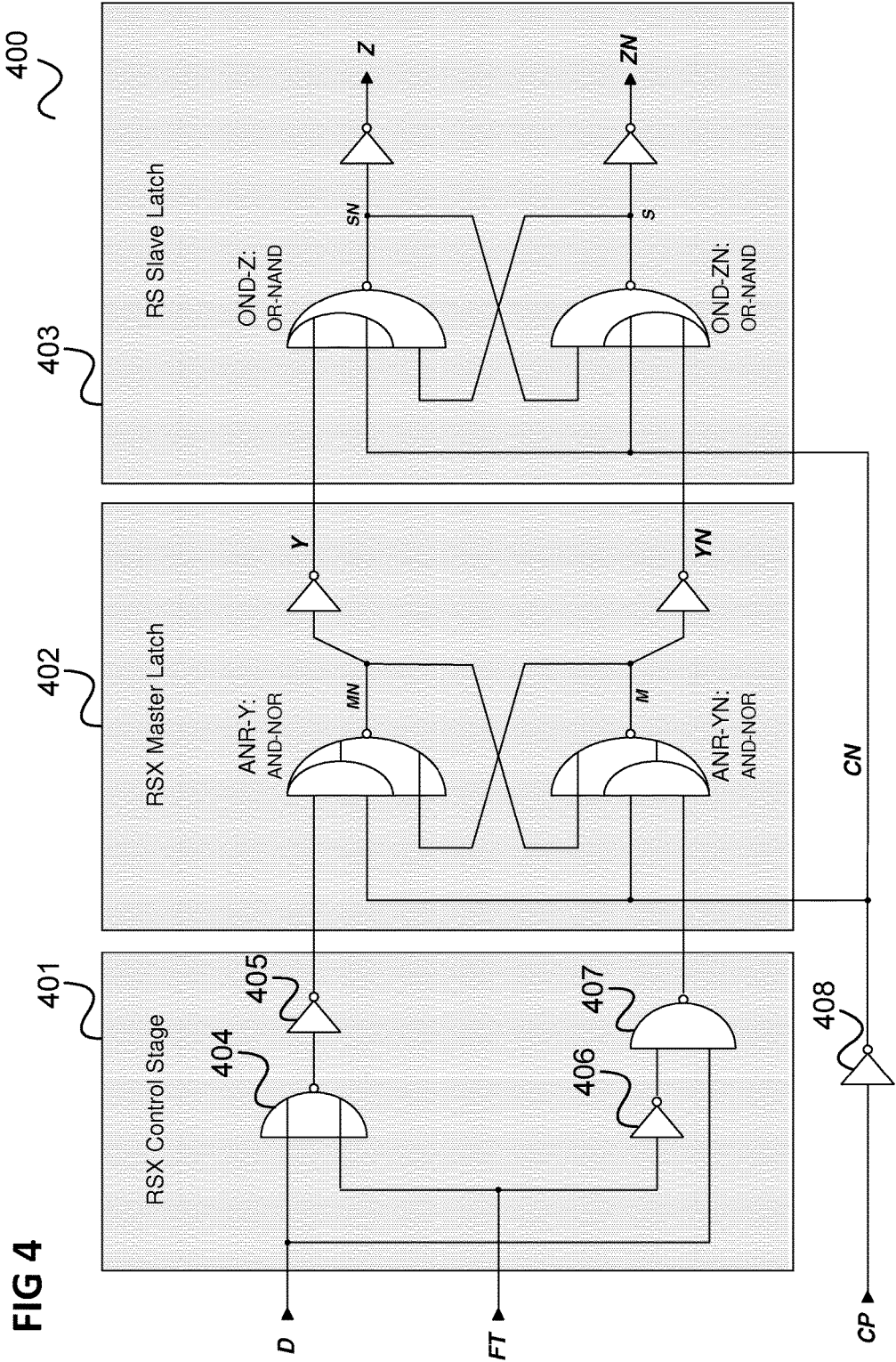
FIG. 4 shows an RSX-based master slave register featuring only one data input.

FIG. 4 shows an RSX-based master slave register 400 featuring only one data input D.

The register 400 comprises an RSX control state 401, an RSX master latch 402 and an RS slave latch 403, wherein the master latch 402 and the slave latch 403 are similar to the master latch 202 and the slave latch 203. The RSX control state 401 in this example receives input signals D and FT, wherein D and FT are supplied to a NOR 404. The output of the NOR 404 is fed to a first inverter 405 whose output is used as input signal S for the master latch 402 as described with reference to FIG. 1.

The input signal FT is further supplied to a second inverter 406 whose output is fed, along with the input signal D, to a NAND 407 whose output is used as input signal R for the master latch 402 as described with reference to FIG. 1.

Similarly to FIG. 2, the register 400 further comprises a third inverter 408 which receives an input signal CP and supplies its output CN as input signal T to the master latch 402 as described with reference to FIG. 1 and to the slave latch 403 as described with reference to FIG. 2.

An RSX-based register where D and DN are guaranteed to be complementary may be deployed like conventional registers featuring an additional RSX mode by which the normal mode of operation is suspended as long as the input FT is active as described with FIG. 3: the rising edge of FT must fulfill a setup time as well as a hold time with respect to the rising edge of CP, and the falling edge of FT must fulfill a setup time with respect to the falling edge of CP.

In this RSX mode the register 400 outputs the Magic Hood value (X,$\overline{X}$) after the rising edge of CP following the activation of FT and as long as FT is not deactivated. It should be noted that, for one thing, this RSX mode may either be applied for more than one register of a given piece of circuitry at a time, e.g. as a Magic Hood initial value for (some or all) registers of a state machine or a shift register. However, it is also possible to activate the RSX mode for each of these registers individually, e.g. depending on certain conditions evaluated in the state machine's or shift register's feedback (or general) control logic. The timing condition for FT may easily be ensured by implementing conventional latches whose outputs are connected to the FT signals in question and which are only transparent for CP=0.

As a second possible mode of operation (i.e. a second application) for the RSX based register 200 the case that the inputs (D, DN) are not always complementary and that they change their values only during the second part of the clock cycle when CP=0 is considered.

Then, in case of (D, DN)=(1, 1) during CP=1 (where (D, DN) change to (1, 1) with a setup time relative to the rising CP edge, and from (1, 1) with a hold time relative to the falling CP edge) the same behavior results as described for the RSX mode activated with FT=1 above: the register outputs (X,$\overline{X}$) with the rising CP edge.

On the other hand, in case of (D, DN)=(0, 0) during CP=1 (where (D, DN) change to (0, 0) with a setup time relative to the rising CP edge, and from (0, 0) with a hold time relative to the falling CP edge) the register outputs remain in their previously assumed state, i.e. no new data are captured from the data inputs with the rising CP edge.

Figure 5:
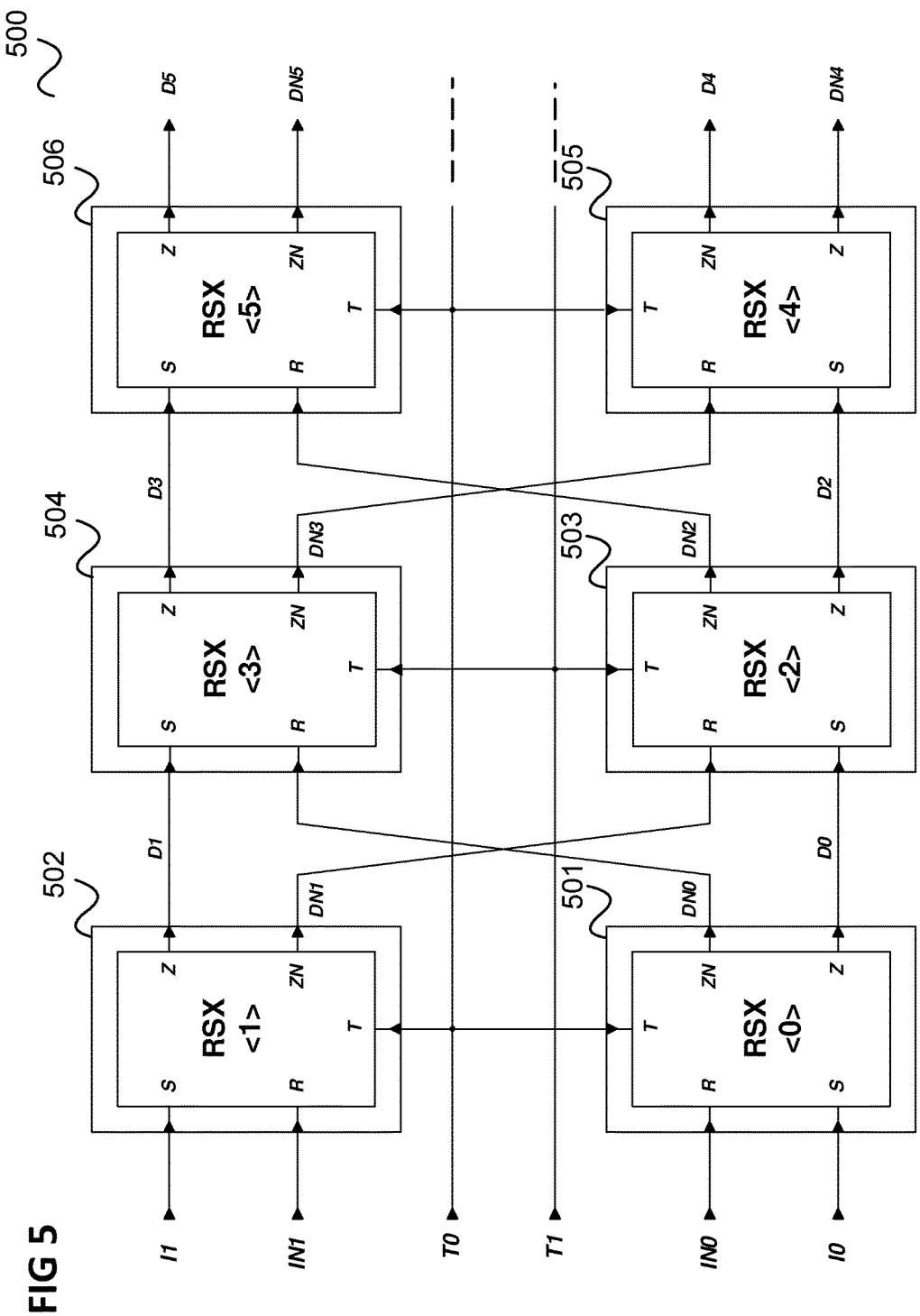
FIG. 5 shows a RSX latch-based double-chain shift register.

FIG. 5 shows a RSX latch-based double-chain shift register 500.

The shift register 500 comprises six RSX latches 501 to 506 as described or equivalent to the RSX latch 100 described FIG. 1 above, which are denoted by RSX<j> (j=0, 1, . . . , 5).

The shift register 500 has the input signals I1, IN1, T0, T1, IN0 and I0 and the output signals D5, DN5, D4 and DN4.

The input signals I0 and IN0 are supplied as input S and R, respectively, to the first RSX latch 501 (RSX<0>). The input signals I1 and IN1 are supplied as input S and R, respectively, to the second RSX latch 502 (RSX<1>).

The input signal T0 is supplied as input signal T to the first RSX latch 501 (RSX<0>), the second RSX latch 502 (RSX<1>), the fifth RSX latch 505 (RSX<4>) and the sixth RSX latch 506 (RSX<5>).

The input signal T1 is supplied as input signal T to the third RSX latch 503 (RSX<2>) and the fourth RSX latch 504 (RSX<3>).

The output signal Z of the first RSX latch 501 (RSX<0>) is denoted by D0 and is supplied as input signal S to the third RSX latch 503 (RSX<2>). The output signal ZN of the first RSX latch 501 (RSX<0>) is denoted by DN0 and is supplied as input signal R to the fourth RSX latch 504 (RSX<3>).

The output signal Z of the second RSX latch 502 (RSX<1>) is denoted by D1 and is supplied as input signal S to the fourth RSX latch 504 (RSX<3>). The output signal ZN of the second RSX latch 502 (RSX<1>) is denoted by DN1 and is supplied as input signal R to the third RSX latch 503 (RSX<2>).

The output signal Z of the third RSX latch 503 (RSX<2>) is denoted by D2 and is supplied as input signal S to the fifth RSX latch 505 (RSX<4>). The output signal ZN of the third RSX latch 503 (RSX<2>) is denoted by DN2 and is supplied as input signal R to the sixth RSX latch 506 (RSX<5>).

The output signal Z of the fourth RSX latch 504 (RSX<3>) is denoted by D3 and is supplied as input signal S to the sixth RSX latch 506 (RSX<5>). The output signal ZN of the fourth RSX latch 504 (RSX<3>) is denoted by DN3 and is supplied as input signal R to the fifth RSX latch 505 (RSX<4>).

Figure 6:
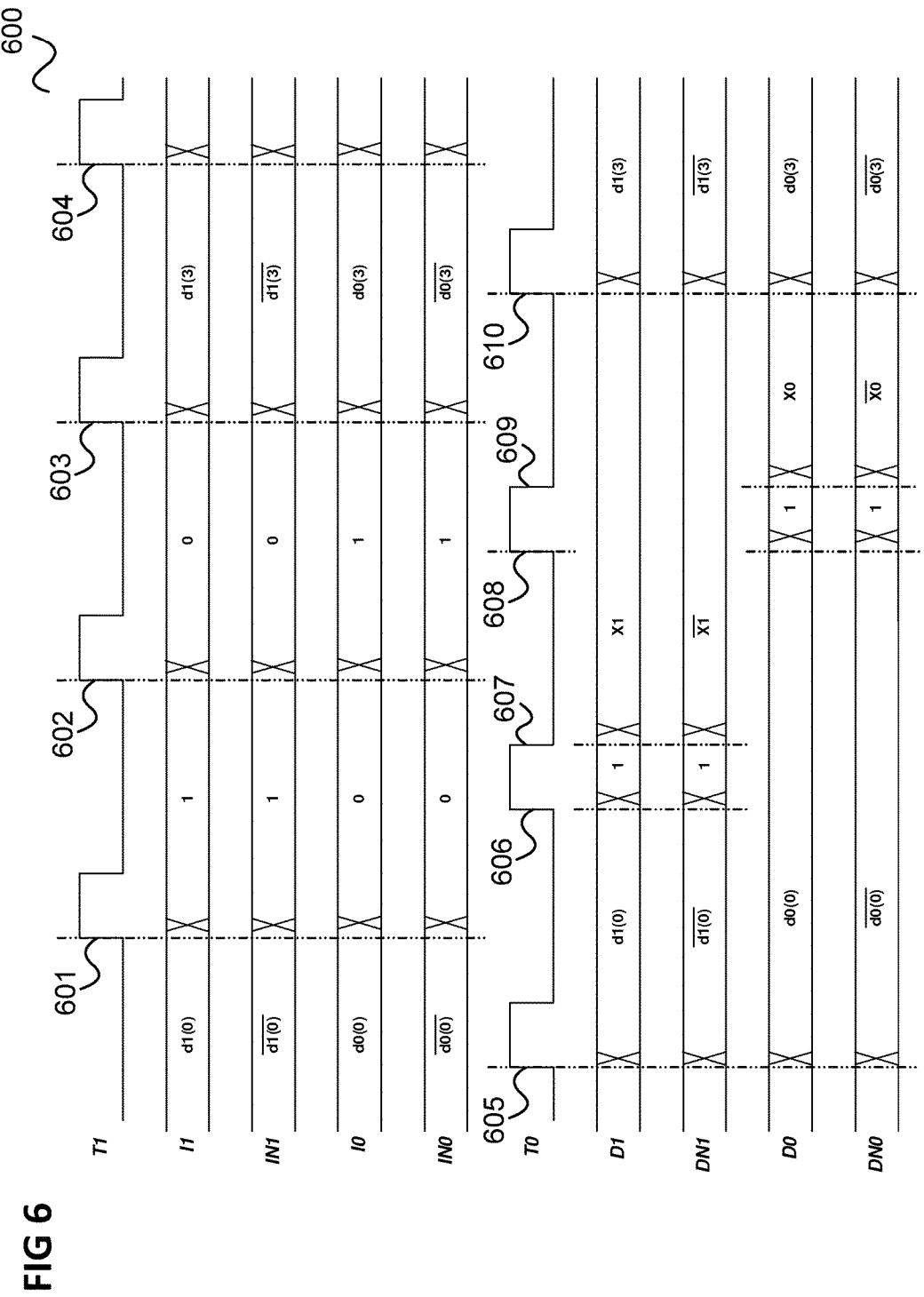
FIG. 6 shows a timing diagram for the RSX latch-based double-chain shift register of FIG. 6.

FIG. 6 shows a timing diagram 600 for the RSX latch-based double-chain shift register 600. It shows the states of the signals T1, I1, IN1, I0, IN0, T0, D1, DN1, D0, DN0 over time, wherein time flows from left to right in FIG. 6.

Thus, the timing diagram 600 illustrates the state over time of the inputs and outputs of the first double-latch stage, i.e. the two RSX latches RSX<1> and RSX<0> together with that of the two non-overlapping clocks T1 and T0 for the consecutive RSX latch stages: T0 being the clock for the first and third stage (and possible further odd stages), i.e. RSX<1>, RSX<0>, RSX<5>, RSX<4> etc., and T1 being the clock for the second stage (and possible further even stages), i.e. for RSX<3>, RSX<2> etc.

In the following, in particular, the reason for (and the concept behind) the swapping of the "DN-outputs" is explained in context of FIG. 6, i.e. the fact that DN1 (DN3) is not connected to the R-pin of RSX<3> (RSX<5>) but to that of RSX<2> (RSX<4>), and that DN0 (DN2) is not connected to the R-pin of RSX<2> (RSX<4>) but to that of RSX<3> (RSX<5>).

The following initial conditions are assumed:
(I1, IN1)=(d1(0), NOT(d1(0))) and
(I0, IN0)=(d0(0), NOT(d0(0))),
i.e. complementary data values for the dual-rail data inputs (I1, IN1) and (I0, IN0) that are stable until the first rising T1 edge 601. Then, with the first rising T0 edge 605, latches RSX<1> and RSX<0> transfer their input data (d1(0), NOT(d1(0)) and (d0(0), NOT(d0(0))) to their outputs (D1, DN1) and (D0, DN0) and keep them there until the next rising T0 edge 606.

With the first rising T1 edge 601, the inputs in this example change to
(I1, IN1)=(1, 1) and
(I0, IN0)=(0, 0)
i.e. non-complementary values for the dual-rail data inputs (I1, IN1) and (I0, IN0) that are then stable until the following rising T1 edge 602. As a consequence, with the next rising T0 edge 606, RSX<1> transfers the data values (1, 1) to its outputs (D1, DN1) causing a "forbidden transition" with the following falling T0 edge 607, resulting in (X1, NOT(X1)) at (D1, DN1), where X1 is the Boolean Secret of RSX<1>.

On the other hand, the same rising T0 edge 606 does not cause any transition at the outputs (D0, DN0) of RSX<0>, since (I0, IN0)=(0, 0) is equivalent to T0=0 at the inputs of a RSX latch of the type shown in FIG. 1.

With the second rising T1 edge 602, the inputs in this example change to
(I1, IN1)=(0, 0) and
(I0, IN0)=(1, 1)
i.e. again non-complementary data values for the dual-rail data inputs (I1, IN1) and (I0, IN0) that are then stable until the following rising T1 edge 603. As a consequence, with the next rising T0 edge 608, RSX<0> transfers the data values (1, 1) to its outputs (D0, DN0) causing a "forbidden transition" with the following falling T0 edge 609, resulting in (X0, NOT(X0)) at (D0, DN0), where X0 is the Boolean Secret of RSX<0>. On the other hand, the same rising T0 edge 608 does not cause any transition at the outputs (D1, DN1) of RSX<1>, since (I1, N1)=(0, 0) is equivalent to T0=0 at the inputs of a RSX latch of the type shown in FIG. 1.

With the third rising T1 edge 603, the inputs in this example change to
(I1, IN1)=(d1(3), NOT(d1(3))) and
(I0, IN0)=(d0(3), NOT(d0(3)))
i.e. complementary data values for the dual-rail data inputs (I1, IN1) and (I0, IN0) that are stable until the next rising T1 edge 604. Then, with the next rising T0 edge 610, latches RSX<1> and RSX<0> transfer their input data (d1(3), NOT(d1(3)) and (d0(3), NOT(d0(3))) to their outputs (D1, DN1) and (D0, DN0) and keep them there until the following rising T0 edge.

From this timing behavior of the section of a RSX latch-based double-chain shift register 500 it follows that the data outputs (D1, DN1) and (D0, DN0) are always complementary before, during and after the clock T1 of the subsequent RSX latch stage (RSX<3> and RSX<2>) gets active (i.e. is switched to 1). This, however, does not mean that the data inputs of RSX<3> and RSX<2> are necessarily complementary because of the swapping of the "DN-outputs", i.e. since DN1 is connected to the R-pin of RSX<2> and DN0 is connected to the R-pin of RSX<3>. That is, complementary values at (D1, DN1) and (D0, DN0) may or may not result in complementary values at the data inputs of RSX<3> and RSX<2> but, due to the swapping, also to values (1, 1) and (0, 0) or vice versa. This justifies the assumption as to the input sequences of the example of FIG. 6, at least if it is assumed that these inputs (I1, IN1) and (I0, IN0) are connected to the outputs of a preceding RSX latch stage according to the same swapping of its "DN-outputs" as shown in FIG. 5. This statement also holds for all following RSX latch stages.

On the other hand, the dual-rail data inputs (I1, IN1) and (I0, IN0), as well as the RSX latch inputs of any RSX stage of a shift register may not only depend on the preceding RSX latch stage's outputs, but also on the outputs of other RSX latches or even on other circuitry as long as the data inputs fulfill the above conditions (i.e. either being both complementary, or being equal to (1, 1) and (0, 0) or vice versa), as well as provided the timing requirements as illustrated in FIG. 6 are met: the dual-rail data inputs of any RSX latch must be stable with a certain setup time before the respective clock edges (T1 or T0), must remain stable during T1=1 and T0=1, and also, with a certain hold time, after the respective falling clock edges.

Figure 7:
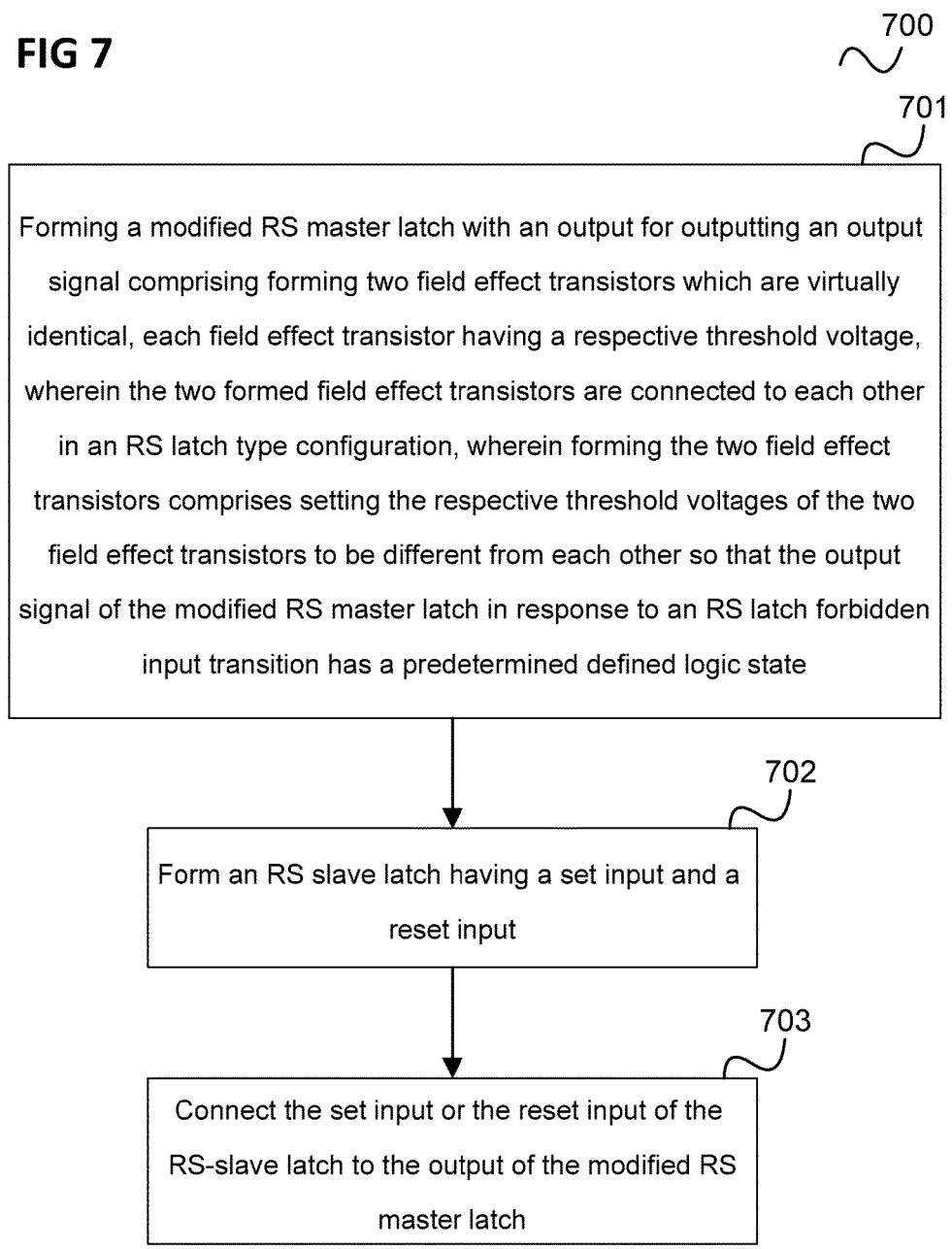
FIG. 7 shows a flow diagram illustrating a method for manufacturing a digital circuit according to an embodiment.

In general, according to various embodiments, a method for manufacturing a digital circuit is provided as illustrated in FIG. 7.

FIG. 7 shows a flow diagram 700.

In 701, a modified RS master latch with an output for outputting an output signal is formed, wherein the forming of the modified RS master latch comprises forming two field effect transistors which are virtually identical, each field effect transistor having a respective threshold voltage, wherein the two formed field effect transistors are connected to each other in an RS latch type configuration, wherein forming the two field effect transistors comprises setting the respective threshold voltages of the two field effect transistors to be different from each other so that the output signal of the modified RS master latch in response to an RS latch forbidden input transition has a predetermined defined logic state.

In 702, an RS slave latch having a set input and a reset input is formed.

In 703, the set input or the reset input of the RS-slave latch is connected to the output of the modified RS master latch.

In other words, a metastable state of an RS master latch (e.g. in a RS-master slave-flip-flop) is shifted to a predefined stable state by setting the threshold voltages of two transistors of the RS master latch accordingly. The threshold voltage may for example be set by a certain doping of a region (e.g. a channel region) of the field effect transistors. For example, the two field effect transistors may be differently doped.

It should be noted that the RS slave latch may also be a modified RS latch similar to the modified RS master latch, i.e. it may comprise two field effect transistors whose threshold voltages are set to be different from each other so that an output signal of the RS slave latch in response to an RS latch forbidden input transition has a predetermined defined logic state.

The two field effect transistors being virtually identical may for example mean that the field effect transistors are geometrically identically designed (i.e. may have same transistor dimensions such as channel width, channel length, source region shape and dimension and drain region shape and dimension). In other words, the field effect transistors form a field effect transistor pair based on their identical geometrical design.

For example, the dimensions of the field effect transistors and their subcomponents (e.g. source region, drain region, etc.) may be identical within the range of manufacturing tolerances, i.e. any detectable differences are due to random manufacturing process variations, e.g. may be within small percentages, for example below 10%. It should be noted that any detectable differences of the dimensions between the field effect transistors the Boolean secret of the modified RS master latch cannot be inferred.

The two field effect transistors being virtually identical may mean that they are visually identical. For example, the two field effect transistors are identical to a degree that optical inspection reveals no difference between the field effect transistors. For example, the field effect transistors are identical to a degree that a difference of the field effect transistors is only be detectable when inspected by means of an electron microscope (rather than an optical microscope). For example, visual differences between the field effect transistors are within the nanometer range.

In contrast to that, to detect the intended differences of the threshold voltages, nano-probing with the purpose of measuring the differences of the transfer characteristics of the respective field effect transistors would be necessary. The field effect transistors could thus be seen to be identical up to the nano-probing.

The approach described above with reference to FIG. 7 for example allows embedding an RSX latch into a synchronous environment, such that the synchronous design flow (e.g. in context of static timing analysis) can have full control over the relevant timings (in particular of the input signals of the RSX latch).

The field effect transistors of the field effect transistor pair may be geometrically identically designed (i.e. may have same transistor dimensions such as channel width, channel length, source region shape and dimension and drain region shape and dimension). In other words, field effect transistors may be paired based on their identical geometrical design. Thus, optical inspection reveals no difference between the field effect transistors.

The field effect transistors are manufactured to have different threshold voltages such that the nodes each have a predetermined defined logic state in response to the forbidden transition. For example, the field effect transistors are manufactured in a way such that the expected value of the difference of their threshold voltages is a multiple of the standard deviation of the difference of their threshold voltages.

Figure 8:
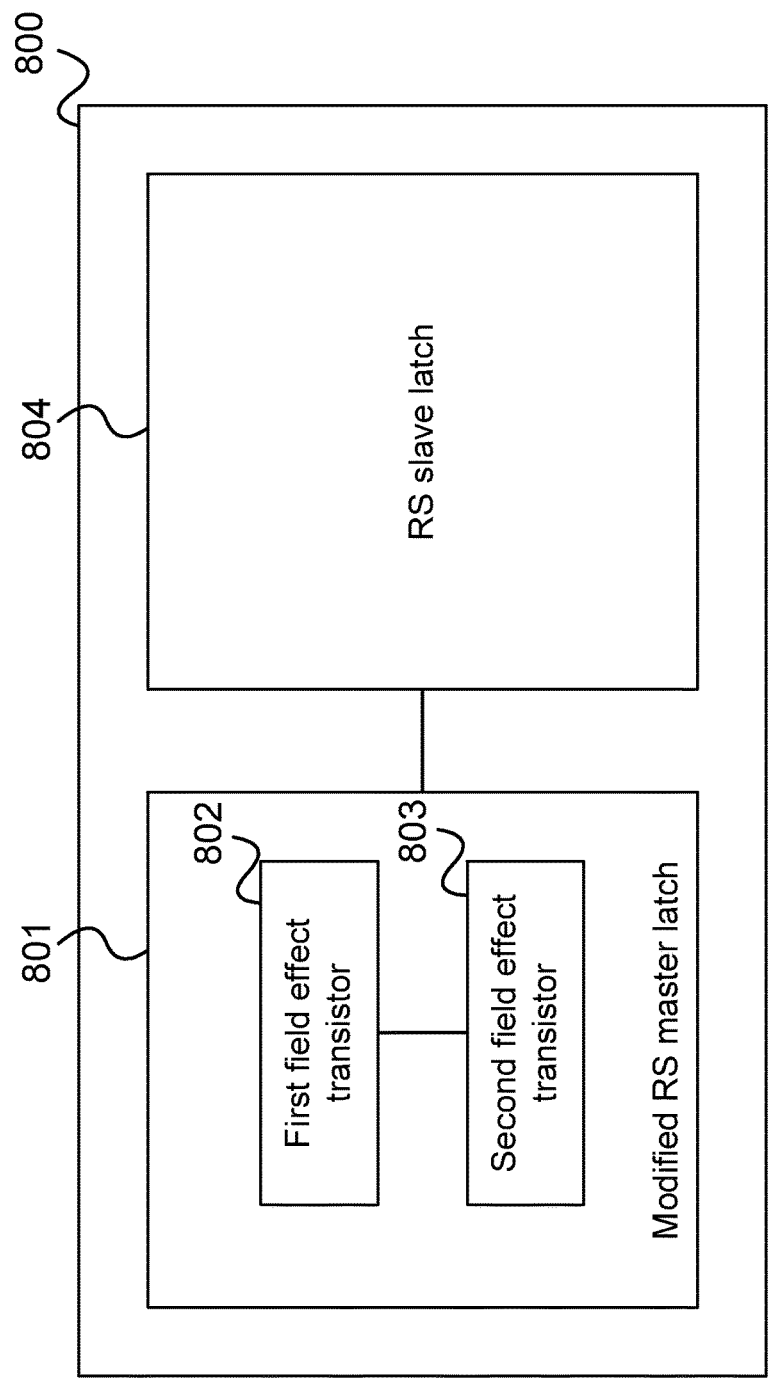
FIG. 8 shows a digital circuit according to an embodiment.

According to one embodiment, for example, an integrated circuit as illustrated in FIG. 8 is formed.

FIG. 8 shows a digital circuit 800 according to an embodiment.

The digital circuit 800 comprises a modified RS master latch 801 comprising an output for outputting an output signal and two field effect transistors 802, 803 which are virtually identical, each field effect transistor 802, 803 having a respective threshold voltage, wherein the two formed field effect transistors 802, 803 are connected to each other in an RS latch type configuration.

The digital circuit 800 further comprises an RS slave latch 804 having a set input and a reset input wherein the set input or the reset input of the RS-slave latch 804 is connected to the output of the modified RS master latch and wherein the threshold voltages of the two field effect transistors differ by at least 10 mV such that the output signal of the modified RS master latch in response to an RS latch forbidden input transition has a predetermined defined logic state.

In the following, various embodiments are indicated.

Embodiment 1 is a method for manufacturing a digital circuit as illustrated in FIG. 7.

Embodiment 2 is a method according to embodiment 1, wherein the RS latch forbidden transition is a transition of an input which causes a normal RS latch to have an undefined logic state.

Embodiment 3 is a method according to embodiment 1 or 2, comprising setting the threshold voltage of the at least one of the field effect transistors by a corresponding doping of a semiconductor region of the field effect transistor.

Embodiment 4 is a method according to any one of embodiments 1 to 3, wherein the RS latch forbidden input transition causes an RS latch having two field effect transistors connected to each other in RS latch type configuration which are virtually identical and have the same threshold voltage to have an undefined logic state.

Embodiment 5 is a method according to any one of embodiments 1 to 4, further comprising forming an input circuit having a first output and a second output and connecting the first output of the input circuit to a set input of the modified RS master latch and the second output of the input circuit to a reset input of the modified RS master latch such that the input circuit performs, in response to a predetermined input, an RS latch forbidden input transition at the set input and the reset input of the modified RS master latch.

Embodiment 6 is a method according to any one of embodiment s1 to 5, further comprising forming the modified RS master latch to have a first clock input and the RS slave latch to have a second clock input and connecting the first clock input and the second clock input to a common clock signal source.

Embodiment 7 is a method according to embodiment 6, comprising configuring the modified RS master latch and the RS slave latch to capture input data in different clock half cycles.

Embodiment 8 is a method according to any one of embodiments 1 to 7, wherein the two field effect transistors are both n channel field effect transistors or the two field effect transistors are both p channel field effect transistors.

Embodiment 9 is a method according to any one of embodiments 1 to 8, wherein the field effect transistors are MOSFETs.

Embodiment 10 is a method according to any one of embodiments 1 to 9, wherein forming the modified RS master latch comprises forming two competing paths, wherein one of the competing paths comprises one of the field effect transistors and the other competing path comprises the other of the field effect transistors.

Embodiment 11 is a method according to embodiment 10, comprising forming the competing paths such that the output signal of the modified RS master latch in response to the RS latch forbidden input transition depends on the result of the competition of the two competing paths.

Embodiment 12 is a method according to any one of embodiments 1 to 11, comprising forming each of the competing paths to comprise a plurality of field effect transistors and setting the threshold voltages of the plurality of field effect transistors such that the output signal of the modified RS master latch in response to the RS latch forbidden input transition has the predetermined defined logic state.

Embodiment 13 is a method according to any one of embodiments 1 to 12, comprising forming the plurality of field effect transistors in CMOS technology.

Embodiment 14 is a method according to any one of embodiments 1 to 13, wherein the predetermined defined logic state is a logic 0 or a logic 1.

Embodiment 15 is a method according to any one of embodiments 1 to 14, comprising forming the modified RS master latch to comprise a Q output and a $\overline{Q}$ output Embodiment 16 is a method according to embodiment 15, wherein the output is the Q output or the $\overline{Q}$ output of the modified RS master latch.

Embodiment 17 is a method according to embodiment 15 or 16, comprising connecting the set input of the RS-slave latch to one of the Q output and $\overline{Q}$ output of the RS master latch and connecting the reset input of the RS-slave latch to the other of the Q output and $\overline{Q}$ output of the RS master latch.

Embodiment 18 is a method according to any one of embodiments 15 to 17, comprising connecting the set input or the reset input of the RS-slave latch to one of the Q output and $\overline{Q}$ output of the modified RS master latch, forming a further RS slave latch circuit having a set input and a reset input and connecting the set input or the reset input of the further RS-slave latch to the other of the Q output and $\overline{Q}$ output of the modified RS master latch.

Embodiment 19 is a method according to any one of embodiment 1 to 18, comprising connecting one of the set input and the reset input of the RS-slave latch to the output of the modified RS master latch and connecting the other of the set input and the reset input to an output of a further modified RS master latch.

Embodiment 20 is a digital circuit as illustrated in FIG. 8.

Embodiment 21 is a digital circuit according to claim 20, wherein the threshold voltages of the field effect transistors differ by at least 20 mV, by at least 30 mV or by at least 50 mV.

It should be noted that embodiments described in context of the method illustrated in FIG. 7 are analogously valid for the integrated circuit 800 and vice versa.

Possibilities to set the threshold voltage of a field effect transistor are described in the following with reference to FIG. 9.

Figure 9:
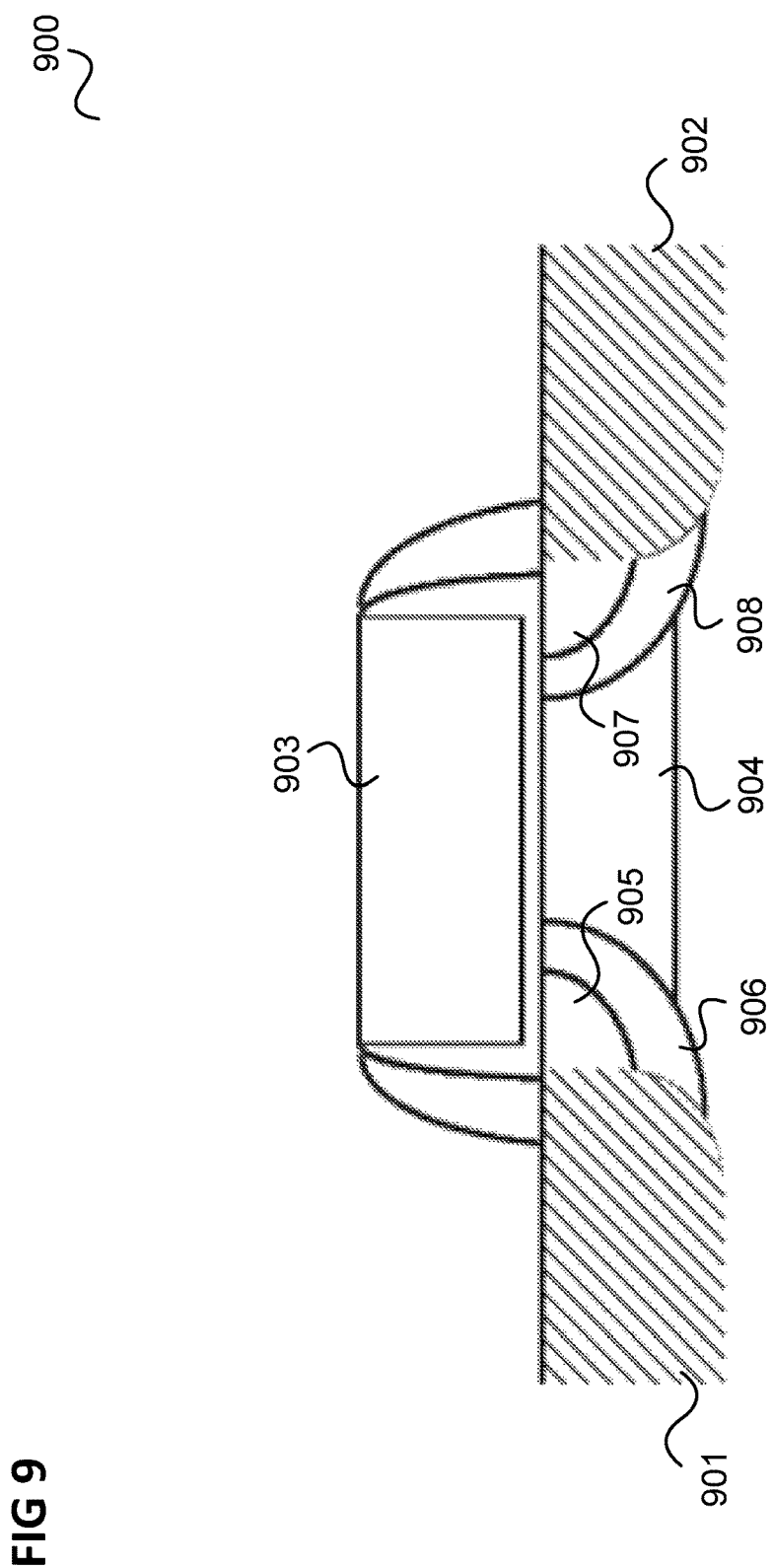
FIG. 9 shows a field effect transistor.

FIG. 9 shows a field effect transistor (FET) 900.

The FET 900 includes a source region 901, a drain region 902, a gate 903 and a channel region 904. The channel region 904 may lie in a substrate or in a well within the substrate.

The source region 901 has an extension 905 and a halo 906. Similarly, the drain region 902 has an extension 907 and a halo 908.

The threshold voltage of the FET 900 can be set by setting appropriate doping concentrations in the channel region 904, of the halos 906, 908 and/or setting the doping concentration in the extensions 905, 907.

Figure 10:
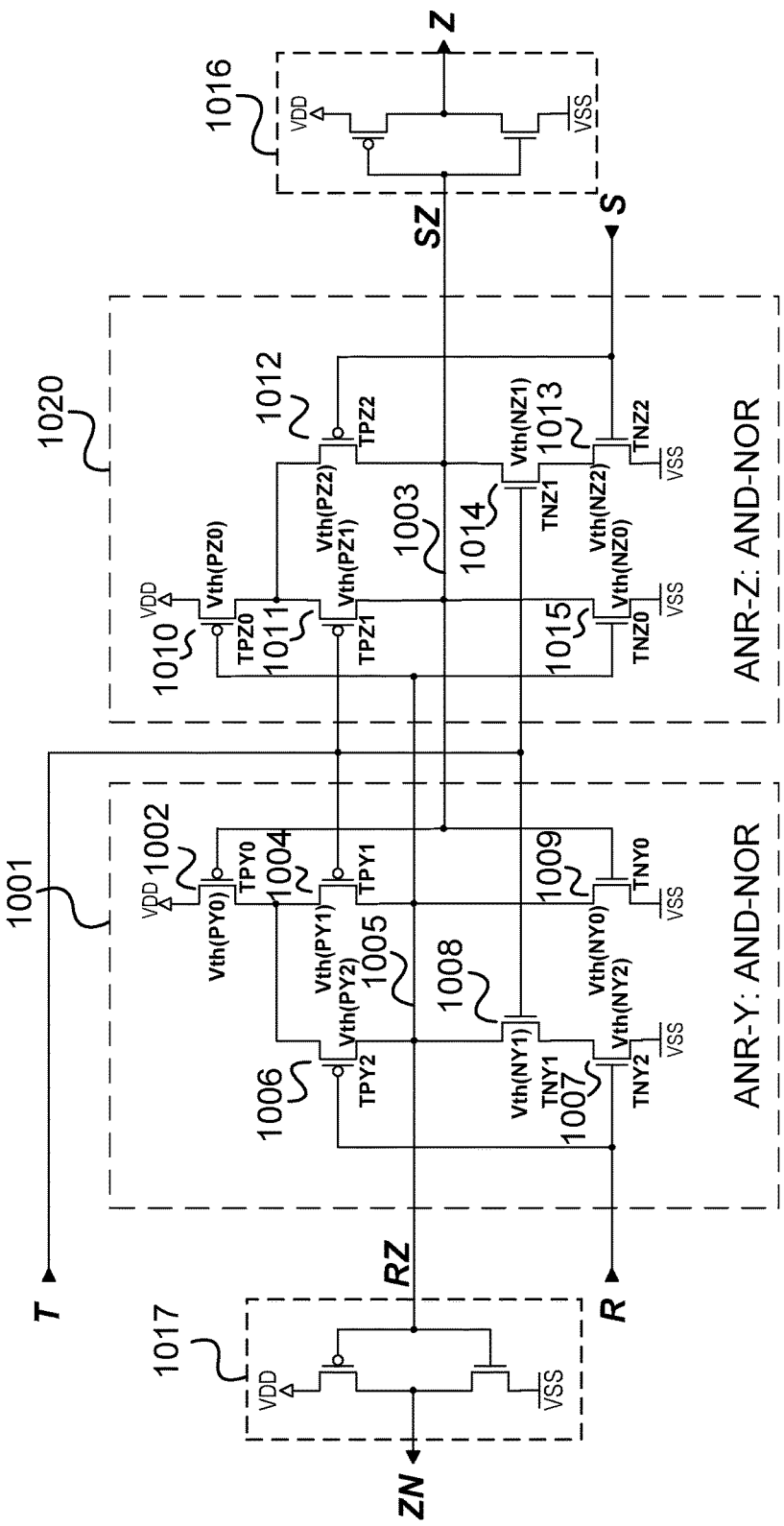
FIG. 10 shows an RSX latch on transistor level.

For illustrating how the approach of FIG. 7 may be applied to an RSX latch, a representation of an AND-NOR based RSX latch as shown in FIG. 1 on transistor level is shown in FIG. 10.

FIG. 10 shows an RSX latch 1000 on transistor level.

Corresponding to the RSX latch 100, the RSX latch 1000 receives input signals S, T and R and outputs output signals Z and ZN.

The RSX latch 1000 comprises a first AND-NOR 1001 and a second AND-NOR 1020.

The first AND-NOR 1001 comprises a first p channel FET 1002 whose source is connected to the high supply potential (VDD), whose gate is connected to a first output node 1003 whose state is denoted as SZ and whose drain is connected to the source of a second p channel FET 1004 whose gate is supplied with the input signal T and whose drain is connected to a second output node 1005 whose state is denoted as RZ. The drain of the first p channel FET 1002 is further connected to the source of a third p channel FET 1006 whose gate is supplied with the input signal R and whose drain is connected to the second output node 1005.

Further, the first AND-NOR 1001 comprises a first n channel FET 1007 whose source is connected to the low supply potential (VSS), whose gate is supplied with the input signal R and whose drain is connected to the source of a second n channel FET 1008 whose gate is supplied with the input signal T and whose drain is connected to the second output node 1005. The first AND-NOR 1001 further comprises a third n channel FET 1009 whose gate is connected to the first output node 1003 and whose drain is connected to the second output node 1005.

The second AND-NOR 1020 comprises a fourth p channel FET 1010 whose source is connected to the high supply potential (VDD), whose gate is connected to the second output node 1005 and whose drain is connected to the source of a fifth p channel FET 1011 whose gate is supplied with the input signal T and whose drain is connected to the first output node 1003. The drain of the fourth p channel FET 1010 is further connected to the source of a sixth p channel FET 1012 whose gate is supplied with the input signal S and whose drain is connected to the first output node 1003.

Further, the second AND-NOR 1020 comprises a fourth n channel FET 1013 whose source is connected to the low supply potential (VSS), whose gate is supplied with the input signal S and whose drain is connected to the source of a fifth n channel FET 1014 whose gate is supplied with the input signal T and whose drain is connected to the first output node 1003. The second AND-NOR 1020 further comprises a sixth n channel FET 1015 whose gate is connected to the second output node 1005 and whose drain is connected to the first output node 1003.

The first output node 1003 is connected to the input of a first inverter 1016 whose output is the output Z and the second output node 1005 is connected to the input of a second inverter 1017 whose output is the output ZN.

As illustrated, the inverters are for example realized by a p channel FET and an n channel FET connected serially between the high supply potential and the low potential which receive the inverter's input at their gates and wherein the node between them is the output node of the respective inverter.

While specific aspects have been described, it should be understood by those skilled in the art that various changes in form and detail may be made therein without departing from the spirit and scope of the aspects of this disclosure as defined by the appended claims. The scope is thus indicated by the appended claims and all changes which come within the meaning and range of equivalency of the claims are therefore intended to be embraced.

What is claimed is:

1. A method for manufacturing a digital circuit comprising:
   forming a modified RS master latch with an output for outputting an output signal comprising:
      forming two gates, wherein each gate comprises two or more field effect transistors which are virtually identical, each field effect transistor having a respective threshold voltage, wherein the two formed gates are cross-coupled to each other in an RS latch type configuration; and wherein the two formed gates receive a shared input signal;

wherein the two or more field effect transistors comprises setting the respective threshold voltages of the two or more field effect transistors to be different from each other so that the output signal of the modified RS master latch in response to an RS latch forbidden input transition has a predetermined defined logic state;

forming an RS slave latch having a set input and a reset input;

forming the modified RS master latch to have a first clock input and the RS slave latch to have a second clock input and wherein the first clock input and the second clock input are connected to a common clock signal source; and connecting the set input or the reset input of the RS-slave latch to the output of the modified RS master latch.

2. The method according to claim 1, wherein the RS latch forbidden transition is a transition of an input which causes a normal RS latch to have an undefined logic state.

3. The method according to claim 1, comprising setting the threshold voltage of the at least one of the field effect transistors by a corresponding doping of a semiconductor region of the field effect transistor.

4. The method according to claim 1, wherein the RS latch forbidden input transition causes an RS latch having two field effect transistors connected to each other in RS latch type configuration which are virtually identical and have the same threshold voltage to have an undefined logic state.

5. The method according to claim 1, further comprising forming an input circuit having a first output and a second output and connecting the first output of the input circuit to a set input of the modified RS master latch and the second output of the input circuit to a reset input of the modified RS master latch such that the input circuit performs, in response to a predetermined input, an RS latch forbidden input transition at the set input and the reset input of the modified RS master latch.

6. The method according to claim 1, comprising configuring the modified RS master latch and the RS slave latch to capture input data in different clock half cycles.

7. The method according to claim 1, wherein the two field effect transistors are both n channel field effect transistors or the two field effect transistors are both p channel field effect transistors.

8. The method according to claim 1, wherein the field effect transistors are MOSFETs.

9. The method according to claim 1, wherein forming the modified RS master latch comprises forming two competing paths, wherein one of the competing paths comprises one of the field effect transistors and the other competing path comprises the other of the field effect transistors.

10. The method according to claim 9, comprising forming the competing paths such that the output signal of the modified RS master latch in response to the RS latch forbidden input transition depends on the result of the competition of the two competing paths.

11. The method according to claim 1, comprising forming each of the competing paths to comprise a plurality of field effect transistors and setting the threshold voltages of the plurality of field effect transistors such that the output signal of the modified RS master latch in response to the RS latch forbidden input transition has the predetermined defined logic state.

12. The method according to claim 1, comprising forming the plurality of field effect transistors in CMOS technology.

13. The method according to claim 1, wherein the predetermined defined logic state is a logic 0 or a logic 1.

14. The method according to claim 1, comprising forming the modified RS master latch to comprise a Q output and a $\overline{Q}$ output.

15. The method according to claim 14, wherein the output is the Q output or the $\overline{Q}$ output of the modified RS master latch.

16. The method according to claim 14, comprising connecting the set input of the RS-slave latch to one of the Q output and $\overline{Q}$ output of the RS master latch and connecting the reset input of the RS-slave latch to the other of the Q output and $\overline{Q}$ output of the RS master latch.

17. The method according to claim 14, comprising connecting the set input or the reset input of the RS-slave latch to one of the Q output and $\overline{Q}$ output of the modified RS master latch, forming a further RS slave latch circuit having a set input and a reset input and connecting the set input or the reset input of the further RS-slave latch to the other of the Q output and $\overline{Q}$ output of the modified RS master latch.

18. The method according to claim 1, comprising connecting one of the set input and the reset input of the RS-slave latch to the output of the modified RS master latch and connecting the other of the set input and the reset input to an output of a further modified RS master latch.

19. A digital circuit comprising
a modified RS master latch comprising an output for outputting an output signal and two gates, wherein each gate comprises two or more field effect transistors which are virtually identical, each field effect transistor having a respective threshold voltage, wherein the two formed gates are cross-coupled to each other in an RS latch type configuration; wherein the two field effect gates receive a shared input signal;

wherein the modified RS master latch has a first clock input and the RS slave latch has a second clock input and wherein the first clock input and the second clock input are connected to a common clock signal source;

an RS slave latch having a set input and a reset input;

wherein the set input or the reset input of the RS-slave latch is connected to the output of the modified RS master latch and wherein the threshold voltages of the two field effect transistors differ by at least 10 mV such that the output signal of the modified RS master latch in response to an RS latch forbidden input transition has a predetermined defined logic state.

20. The digital circuit according to claim 19, wherein the threshold voltages of the field effect transistors differ by at least 20 mV, by at least 30 mV or by at least 50 mV.

\* \* \* \* \*